(12) United States Patent
Chuang et al.

(10) Patent No.: US 12,412,852 B2
(45) Date of Patent: Sep. 9, 2025

(54) POLYMER LAYERS EMBEDDED WITH METAL PADS FOR HEAT DISSIPATION

(71) Applicant: Taiwan Semiconductor Manufacturing Co., Ltd., Hsinchu (TW)

(72) Inventors: Hao-Hsiang Chuang, Taipei (TW); Shih-Wei Liang, Dajia Township (TW); Ching-Feng Yang, Taipei (TW); Kai-Chiang Wu, Hsinchu (TW); Hao-Yi Tsai, Hsinchu (TW); Chuei-Tang Wang, Taichung (TW); Chen-Hua Yu, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 270 days.

(21) Appl. No.: 17/844,876

(22) Filed: Jun. 21, 2022

(65) Prior Publication Data

US 2022/0320024 A1    Oct. 6, 2022

Related U.S. Application Data

(60) Continuation of application No. 16/166,829, filed on Oct. 22, 2018, now Pat. No. 11,398,440, which is a
(Continued)

(51) Int. Cl.
*H01L 23/00* (2006.01)
*H01L 21/56* (2006.01)
(Continued)

(52) U.S. Cl.
CPC .............. *H01L 24/03* (2013.01); *H01L 21/56* (2013.01); *H01L 21/76801* (2013.01);
(Continued)

(58) Field of Classification Search
CPC ... H01L 24/03; H01L 21/56; H01L 21/76801; H01L 21/76802; H01L 21/76831; H01L 21/76877; H01L 23/3171; H01L 23/49568; H01L 23/522; H01L 23/525; H01L 23/53295; H01L 24/06; H01L 24/17; H01L 24/81; H01L 25/0657; H01L 25/50; H01L 23/3192; H01L 23/367; H01L 23/3677; H01L 24/05; H01L 24/11; H01L 24/13;
(Continued)

(56) References Cited

U.S. PATENT DOCUMENTS 8,581,400 B2   11/2013   Liang et al.
2004/0145045 A1   7/2004   Huang et al.
(Continued)

*Primary Examiner* — Caleb E Henry
(74) *Attorney, Agent, or Firm* — Slater Matsil, LLP

(57) ABSTRACT

An integrated circuit structure includes a metal pad, a passivation layer including a portion over the metal pad, a first polymer layer over the passivation layer, and a first Post-Passivation Interconnect (PPI) extending into to the first polymer layer. The first PPI is electrically connected to the metal pad. A dummy metal pad is located in the first polymer layer. A second polymer layer is overlying the first polymer layer, the dummy metal pad, and the first PPI. An Under-Bump-Metallurgy (UBM) extends into the second polymer layer to electrically couple to the dummy metal pad.

20 Claims, 12 Drawing Sheets

Related U.S. Application Data continuation of application No. 14/742,398, filed on Jun. 17, 2015, now Pat. No. 10,109,605, which is a division of application No. 13/907,875, filed on Jun. 1, 2013, now Pat. No. 9,082,761.

(51) Int. Cl.

| | | |
|---|---|---|
| *H01L 21/768* | (2006.01) | |
| *H01L 23/31* | (2006.01) | |
| *H01L 23/367* | (2006.01) | |
| *H01L 23/495* | (2006.01) | |
| *H01L 23/522* | (2006.01) | |
| *H01L 23/525* | (2006.01) | |
| *H01L 23/532* | (2006.01) | |
| *H01L 25/00* | (2006.01) | |
| *H01L 25/065* | (2023.01) | |

(52) U.S. Cl.
CPC .. *H01L 21/76802* (2013.01); *H01L 21/76831* (2013.01); *H01L 21/76877* (2013.01); *H01L 23/3171* (2013.01); *H01L 23/49568* (2013.01); *H01L 23/522* (2013.01); *H01L 23/525* (2013.01); *H01L 23/53295* (2013.01); *H01L 24/06* (2013.01); *H01L 24/17* (2013.01); *H01L 24/81* (2013.01); *H01L 25/0657* (2013.01); *H01L 25/50* (2013.01); *H01L 23/3192* (2013.01); *H01L 23/367* (2013.01); *H01L 23/3677* (2013.01); *H01L 24/05* (2013.01); *H01L 24/11* (2013.01); *H01L 24/13* (2013.01); *H01L 24/16* (2013.01); *H01L 2224/02381* (2013.01); *H01L 2224/0239* (2013.01); *H01L 2224/024* (2013.01); *H01L 2224/0345* (2013.01); *H01L 2224/0346* (2013.01); *H01L 2224/0401* (2013.01); *H01L 2224/05569* (2013.01); *H01L 2224/05572* (2013.01); *H01L 2224/05582* (2013.01); *H01L 2224/05647* (2013.01); *H01L 2224/05666* (2013.01); *H01L 2224/05681* (2013.01); *H01L 2224/06515* (2013.01); *H01L 2224/06519* (2013.01); *H01L 2224/1146* (2013.01); *H01L 2224/11849* (2013.01); *H01L 2224/13007* (2013.01); *H01L 2224/131* (2013.01); *H01L 2224/13147* (2013.01); *H01L 2224/13455* (2013.01); *H01L 2224/13464* (2013.01); *H01L 2224/16225* (2013.01); *H01L 2224/17515* (2013.01); *H01L 2224/17519* (2013.01); *H01L 2224/81801* (2013.01); *H01L 2224/94* (2013.01); *H01L 2225/06513* (2013.01); *H01L 2225/06589* (2013.01)

(58) Field of Classification Search
CPC ........... H01L 24/16; H01L 2224/02381; H01L 2224/0239; H01L 2224/024; H01L 2224/0345; H01L 2224/0346; H01L 2224/0401; H01L 2224/05569; H01L 2224/05572; H01L 2224/05582; H01L 2224/05647; H01L 2224/05666; H01L 2224/05681; H01L 2224/06515; H01L 2224/06519; H01L 2224/1146; H01L 2224/11849; H01L 2224/13007; H01L 2224/131; H01L 2224/13147; H01L 2224/13455; H01L 2224/13464; H01L 2224/16225; H01L 2224/17515; H01L 2224/17519; H01L 2224/81801; H01L 2224/94; H01L 2225/06513; H01L 2225/06589
USPC .......................................................... 438/107
See application file for complete search history.

(56) References Cited

U.S. PATENT DOCUMENTS

| | | | |
|---|---|---|---|
| 2004/0222521 A1* | 11/2004 | Hikita | H01L 24/29 |
| | | | 257/737 |
| 2005/0121804 A1 | 6/2005 | Kuo et al. | |
| 2006/0180928 A1* | 8/2006 | Takahira | H01L 24/13 |
| | | | 257/737 |
| 2006/0292711 A1* | 12/2006 | Su | H01L 24/05 |
| | | | 257/E23.021 |
| 2011/0233763 A1* | 9/2011 | Pendse | H01L 23/3171 |
| | | | 257/737 |
| 2011/0248404 A1 | 10/2011 | Chiu et al. | |
| 2012/0298410 A1 | 11/2012 | Lu et al. | |
| 2013/0093077 A1* | 4/2013 | Liang | H01L 23/3114 |
| | | | 257/737 |
| 2014/0077356 A1* | 3/2014 | Chen | H01L 23/3171 |
| | | | 257/737 |
| 2015/0004751 A1* | 1/2015 | Wu | H01L 21/563 |
| | | | 438/108 |

* cited by examiner

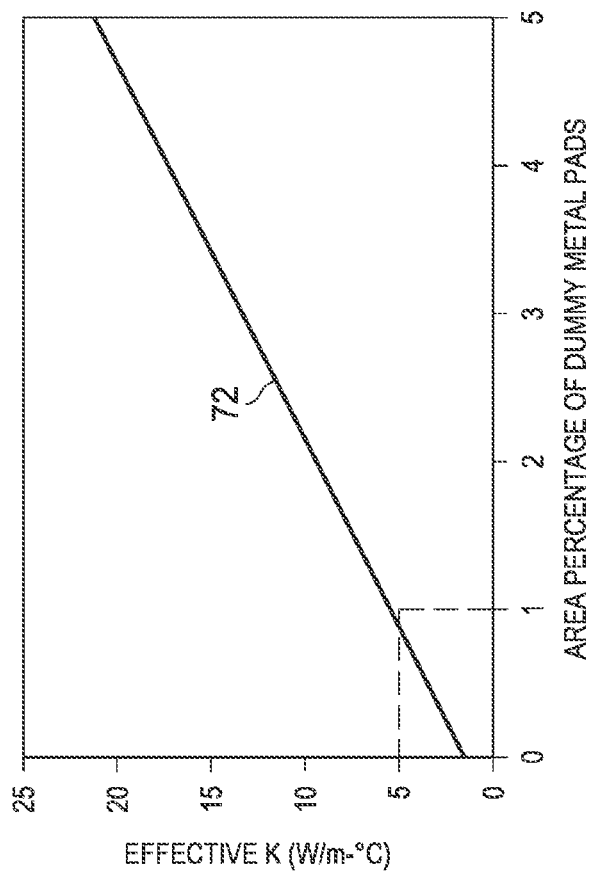

POLYMER LAYERS EMBEDDED WITH METAL PADS FOR HEAT DISSIPATION

PRIORITY CLAIM AND CROSS-REFERENCE

This application is a continuation of U.S. patent application Ser. No. 16/166,829, entitled "Polymer Layers Embedded with Metal Pads for Heat Dissipation," filed on Oct. 22, 2018, which is a continuation of U.S. patent application Ser. No. 14/742,398, entitled "Polymer Layers Embedded with Metal Pads for Heat Dissipation," filed on Jun. 17, 2015, now U.S. Pat. No. 10,109,605 issued Oct. 23, 2018, which is a divisional of U.S. patent application Ser. No. 13/907,875, entitled "Polymer Layers Embedded with Metal Pads for Heat Dissipation," filed on Jun. 1, 2013, now U.S. Pat. No. 9,082,761 issued Jul. 14, 2015, which applications are incorporated herein by reference.

BACKGROUND

Integrated circuit devices such as transistors have increasingly more transistors integrated in dies to meet the increasingly demanding requirement of applications. The saturation currents of the transistors are also increasingly higher in order to achieve faster operation. This results in more heat to be generated in dies. The heat dissipation is thus a severe problem.

Integrated circuit dies typically include a plurality of polymer layers, which are formed over the interconnect structure that is used for interconnecting devices. The polymer layers, however, have low thermal conductivity values. It is very difficult to increase the thermal conductivity of the polymer layers. Although approaches were taken to increase the thermal conductivity of the polymer layers, the manufacturing cost of the high-thermal-conductivity polymer films, however, is very high. This limits the usage of the high-thermal-conductivity polymer films in the integrated circuits.

With the polymer layers being low in efficiency in dissipating heat, the amount of heat that may dissipate through the polymer layers is low. Although the heat may be dissipated through the metal features that are used for conductive electrical signals, overall, the heating dissipating cannot satisfy the requirement of the device die.

BRIEF DESCRIPTION OF THE DRAWINGS

For a more complete understanding of the embodiments, and the advantages thereof, reference is now made to the following descriptions taken in conjunction with the accompanying drawings, in which:

FIG. 12 illustrates simulation results simulating the effects of dummy metal pads.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

An integrated circuit structure including dummy metal pads and the method of forming the same are provided in accordance with various exemplary embodiments. The intermediate stages of forming the dummy metal pads are illustrated. The variations of the embodiments are discussed. Throughout the various views and illustrative embodiments, like reference numbers are used to designate like elements.

Figure 1:
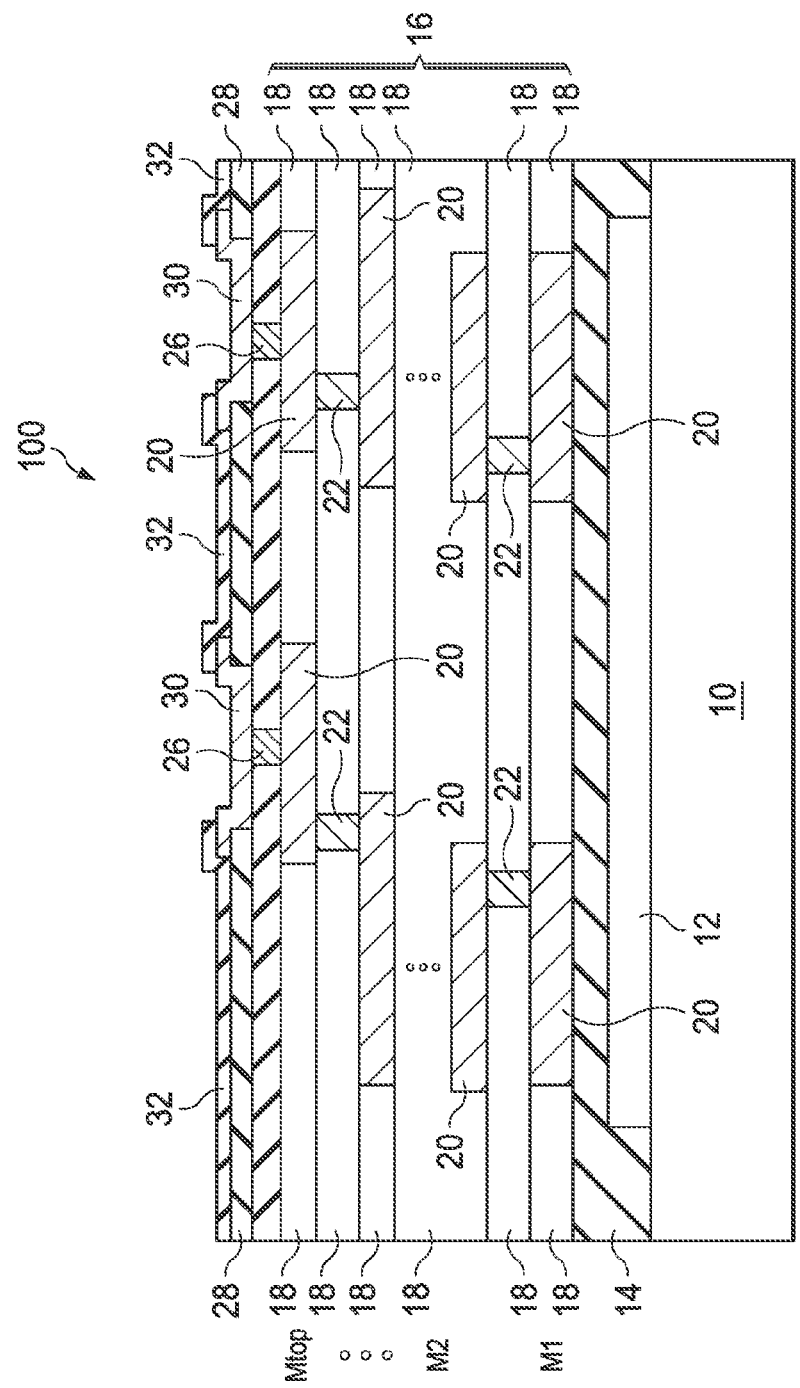
FIGS. 1 through 10 are cross-sectional views of intermediate stages in the manufacturing of a wafer/die including dummy metal pads in accordance with some exemplary embodiments.

Referring to FIG. 1, wafer 100, which includes semiconductor substrate 10, is provided. Semiconductor substrate 10 may be a bulk silicon substrate or a silicon-on-insulator substrate. Alternatively, other semiconductor materials that include group III, group IV, and group V elements may also be used, which may include silicon germanium, silicon carbon, and/or III-V compound semiconductor materials. Integrated circuit devices such as transistors (schematically illustrated as 12) are formed in and/or on semiconductor substrate 10. Wafer 100 may further include Inter-Layer Dielectric (ILD) 14 and interconnect structure 16 over semiconductor substrate 10. Interconnect structure 16 includes metal lines 20 and vias 22, which are formed in dielectric layers 18. The metal lines at a same level are collectively referred to as a metal layer hereinafter. Accordingly, interconnect structure 16 may include a plurality of metal layers that are interconnected through vias 22. Metal lines 20 and vias 22 may be formed of copper or copper alloys, although they can also be formed of other metals. In some embodiments, dielectric layers 18 comprise low-k dielectric materials. The dielectric constants (k values) of the low-k dielectric materials may be less than about 3.0, or less than about 2.5, for example.

The metal layers include bottom metal layer (also referred to as metal layer one, or M1), M2, through a top metal layer (Mtop). In some embodiments, the Mtop layer is the topmost metal layer that is formed in low-k dielectric materials.

In some embodiments, passivation layer 28 is formed over top metal layer Mtop and the respective dielectric layer 18. Passivation layer 28 has a k value greater than 3.8, and is formed using a non-low-k dielectric material. In some embodiments, passivation layer 28 is a composite layer comprising a silicon oxide layer (not shown), and a silicon nitride layer (not shown) over the silicon oxide layer. Passivation layer 28 may also be formed of other non-porous dielectric materials such as Un-doped Silicate Glass (USG), silicon oxynitride, and/or the like.

Metal pads 30 are formed with portions in passivation layer 28, and may be electrically coupled to integrated circuit devices 12 through vias 26, metal lines 20, and vias 22. Metal pads 30 may have some portions extending over passivation layer 28. Metal pads 30 may be aluminum pads or aluminum-copper pads, and hence are alternatively referred to as aluminum pads 30 hereinafter, although other metallic materials may be used. For example, metal pads 30 may have an aluminum (atomic) percentage between about 99.5 percent and about 99.9 percent, and a copper percentage between about 0.1 percent and about 0.5 percent. In FIG. 1, vias 26 are illustrated as connecting the metal lines 20 in Mtop layer to the overlying metal pads 30. In alternative embodiments, metal pads 30 may be in physical contact with the metal lines (or pads) 20 in top metal layer Mtop, with no vias therebetween.

As also shown in FIG. 1, passivation layer 32 is formed over passivation layer 28. The material of passivation layer 32 may be selected from the same candidate materials of passivation layer 28. Passivation layers 28 and 32 may be formed of a same dielectric material, or may be formed of different dielectric materials. In some embodiments, passivation layer 32 includes a silicon oxide layer, and a silicon nitride layer over the silicon oxide layer. Passivation layer 32 is then patterned, so that a portion of passivation layer 32 may cover the edge portions of aluminum pads 30, and central portions of aluminum pads 30 are exposed through the openings in passivation layer 32. Passivation layer 32 may also include a portion level with metal pads 30 in some embodiments.

Figure 2:
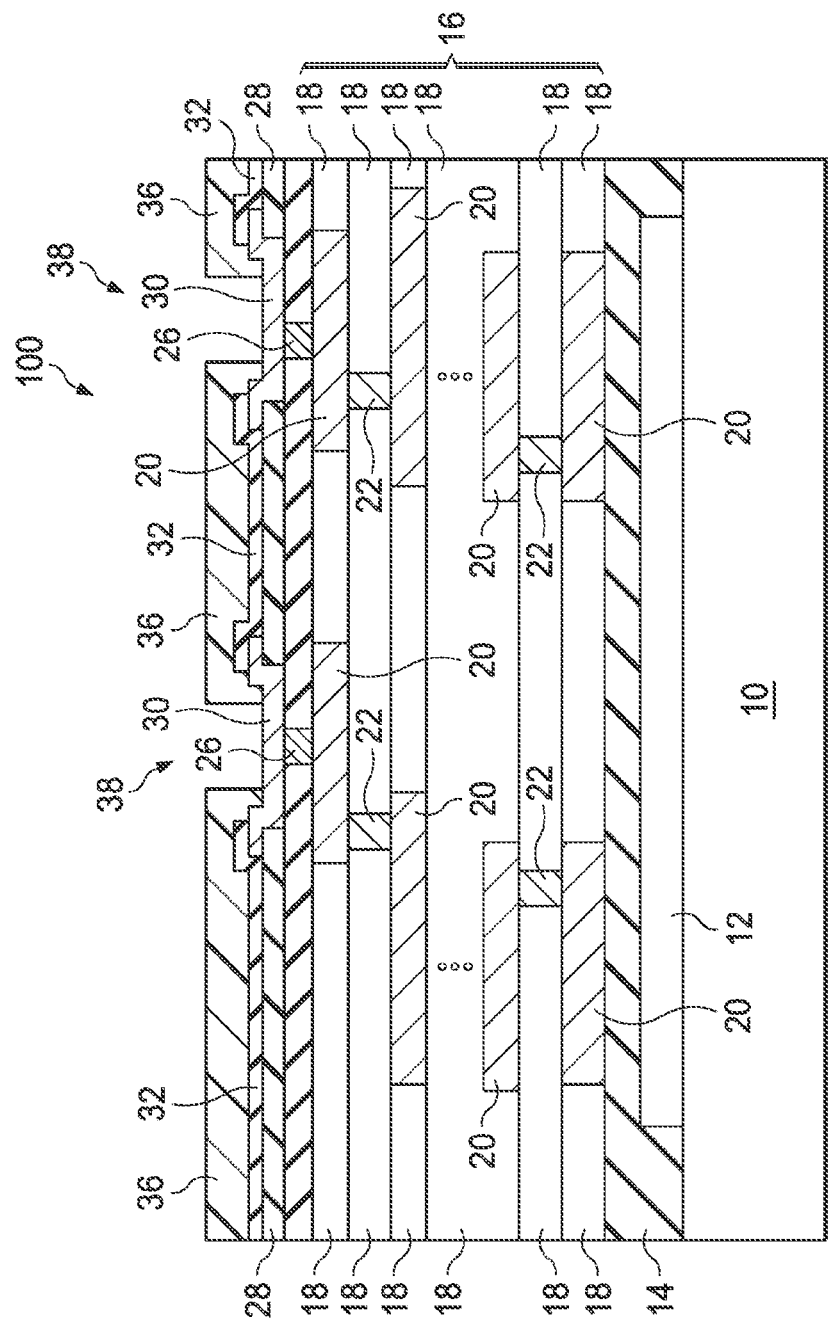

FIG. 2 illustrates the formation of polymer layer 36. The formation process may include spin coating followed by a curing process. As a result of the curing process, polymer layer 36 is solidified. A patterning step is then performed to form openings 38, and central portions of metal pads 30 are exposed through openings 38. In some embodiments, polymer layer 36 is formed of polyimide. In alternative embodiments, polymer layer 36 is formed of other polymers such as benzocyclobutene (BCB), polybenzoxazole (PBO), or the like. The material of polymer layer 36 may be photo sensitive, although non-photo-sensitive materials may also be used. For example, polyimide may be used as the photo sensitive material used in polymer layer 36.

Figure 3:
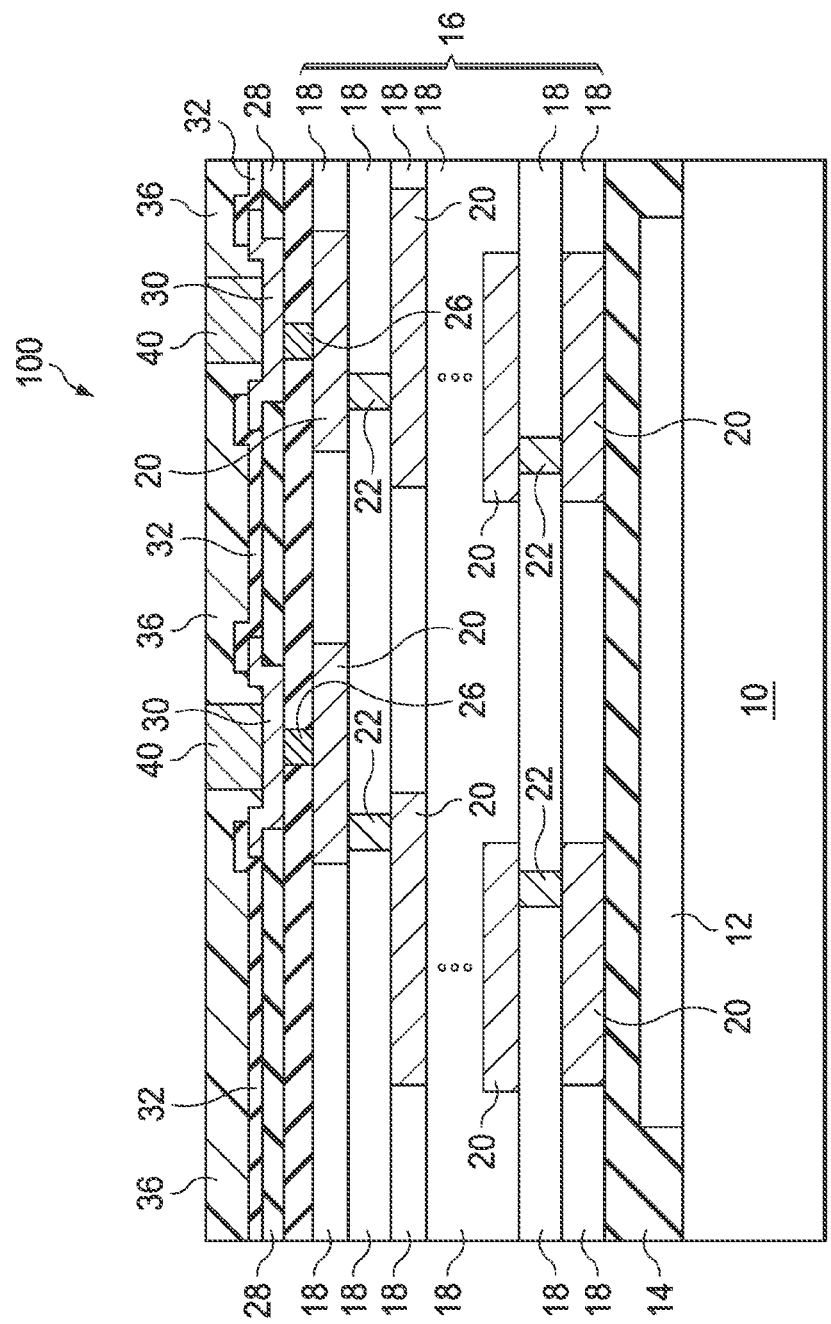

Referring to FIG. 3, metal pillars 40 are formed in openings 38 (FIG. 2), for example, through electroless plating. Hence, metal pillars 40 are formed in polymer layer 36. Metal pillars 40 may comprise copper or other metals or metal alloys including copper, aluminum, tungsten, nickel, cobalt, and/or the like.

Figure 4:
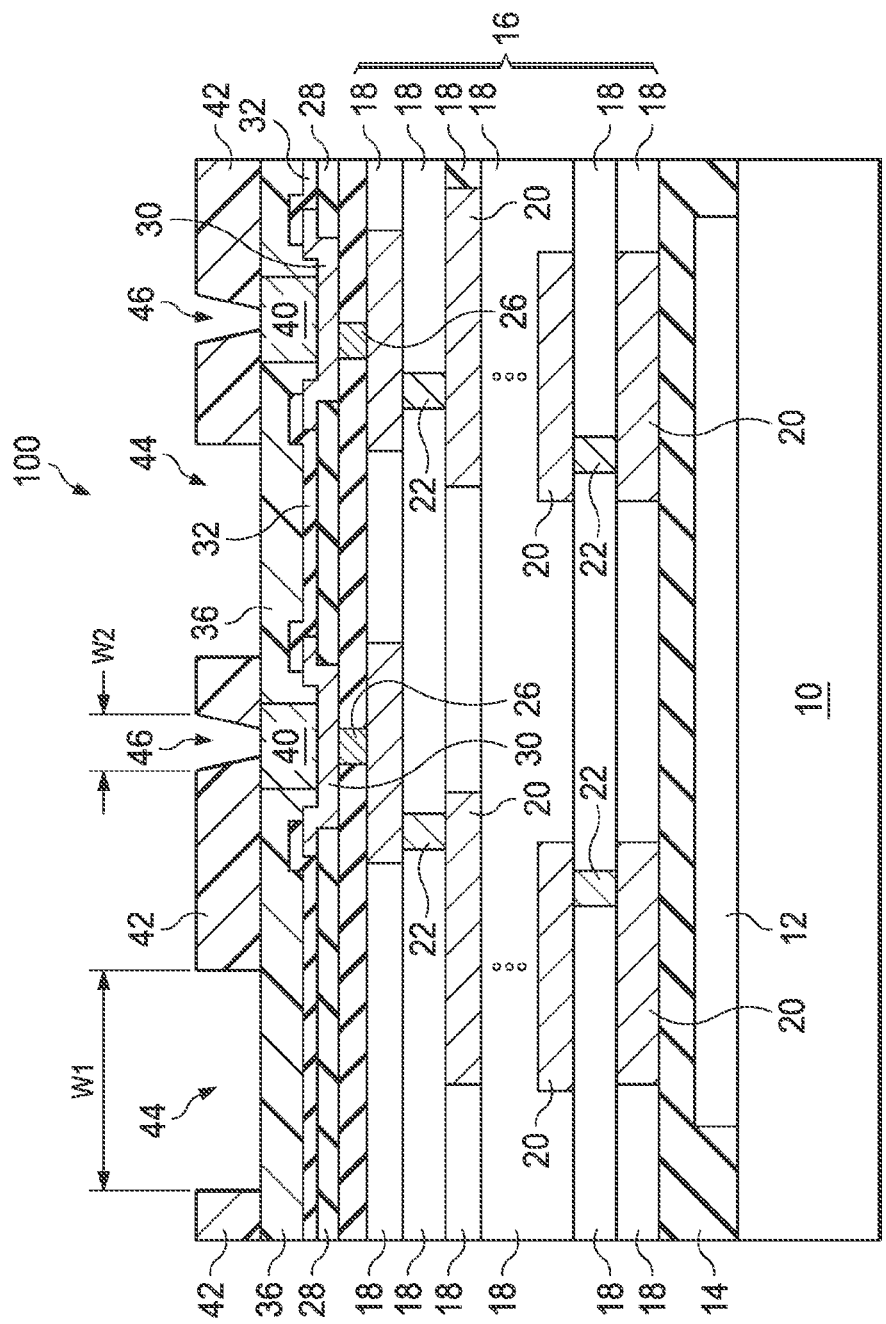

Referring to FIG. 4, polymer layer 42 is formed. In some embodiments, polymer layer 42 is formed of PBO. In alternative embodiments, polymer layer 42 is formed of BCB, polyimide, an epoxy, or the like. Polymer layers 36 and 42 may be formed of a same material, such as polyimide or PBO, or different materials. In some embodiments, polymer layer 42 is formed using spin coating followed by a curing process. Polymer layer 42 is then patterned to form metal pad openings 44 and via openings 46. In accordance with some embodiments, the top surface of polymer layer 36 is exposed through metal pad opening 44, and no metal features (such as metal pillars 40) in polymer layer 36 are exposed through openings 44. On the other hands, metal pillars 40 are exposed through via openings 46. In some embodiments, the shape of metal pad opening 44 can be a circle, a square, a rectangle, and any other shape. Metal pad openings 44 may have horizontal sizes W1 greater than horizontal sizes W2 of via openings, wherein ratio W1/W2 may be between about 2 and about 20. In these embodiments, metal pad openings 44 are formed as discrete openings that are fully surrounded by polymer layer 42, with no trench formed in polymer layer 42 to connect to metal pad openings 44.

Figure 5:
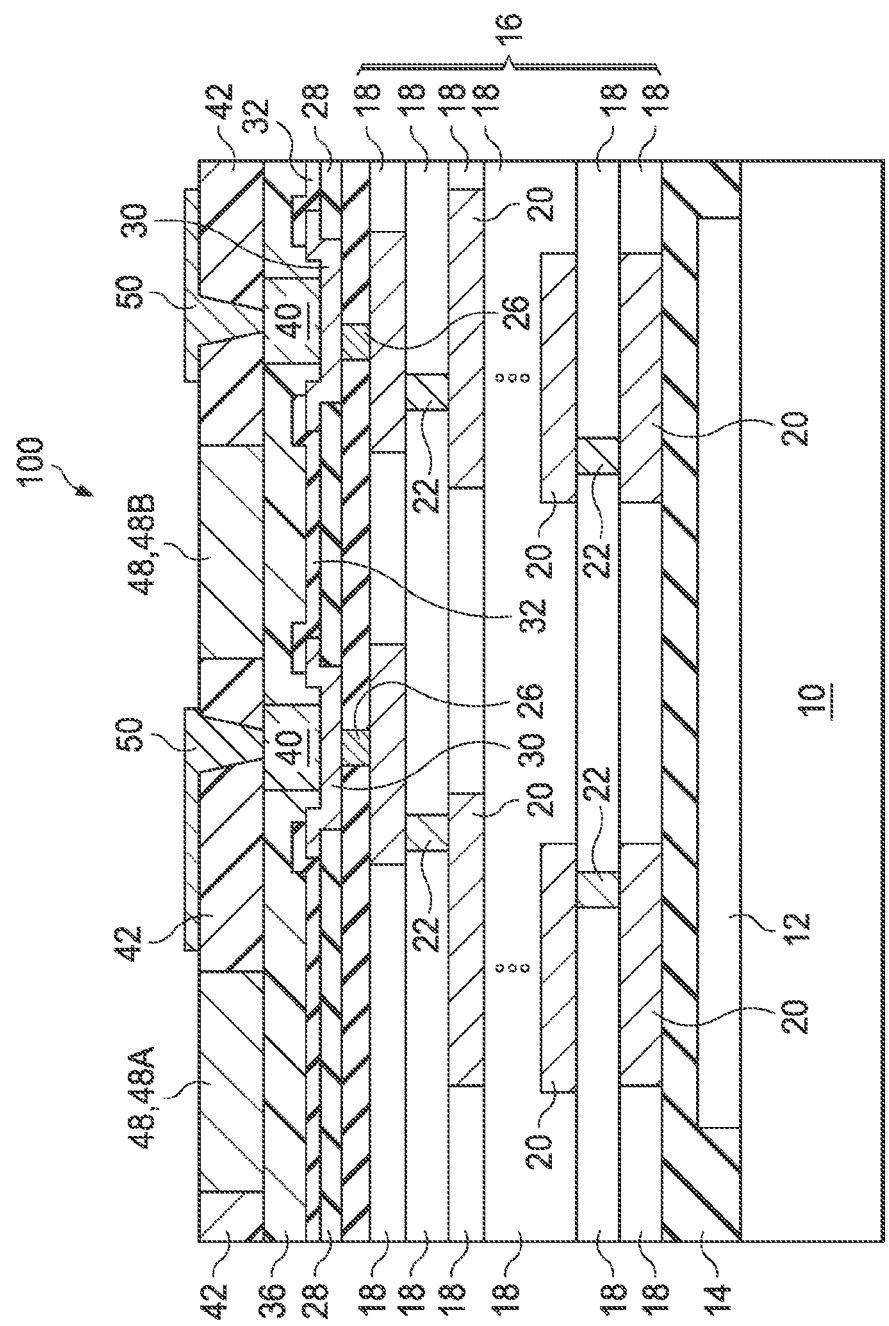

FIG. 5 illustrates the formation of dummy metal pads 48 (including 48A and 48B) and Post-Passivation Interconnect (PPI) 50, which are redistribution lines. Throughout the description, the term "dummy metal pad" refers to the metal pad that is either electrically floating, or is not electrically floating, but is configured not to allow current to flow through. PPIs 50 are electrically coupled to aluminum pads 30 through metal pillars 40 in polymer layer 36. PPIs 50 are such named since the formation of PPIs 50 is after the formation of passivation layers 28 and 32. The formation of dummy metal pads 48 and PPIs 50 may include forming a blanket seed layer (not shown), forming a mask (not shown) to cover some portions of the blanket seed layer, and performing a plating. After the plating, the mask layer is removed, and portions of the seed layer covered by the mask are removed, leaving dummy metal pads 48 and PPIs 50. In the resulting structure, metal pads 48 are formed in metal pad openings 44 (FIG. 4), and PPIs 50 include portions in via openings 46 (FIG. 4), and portions overlying polymer layer 42. Dummy metal pads 48 and PPIs 50 may be formed of pure copper, substantially pure copper (with copper percentage greater than 90 percent), or a copper alloy, although non-copper metals or metal alloys may be used.

Figure 6:
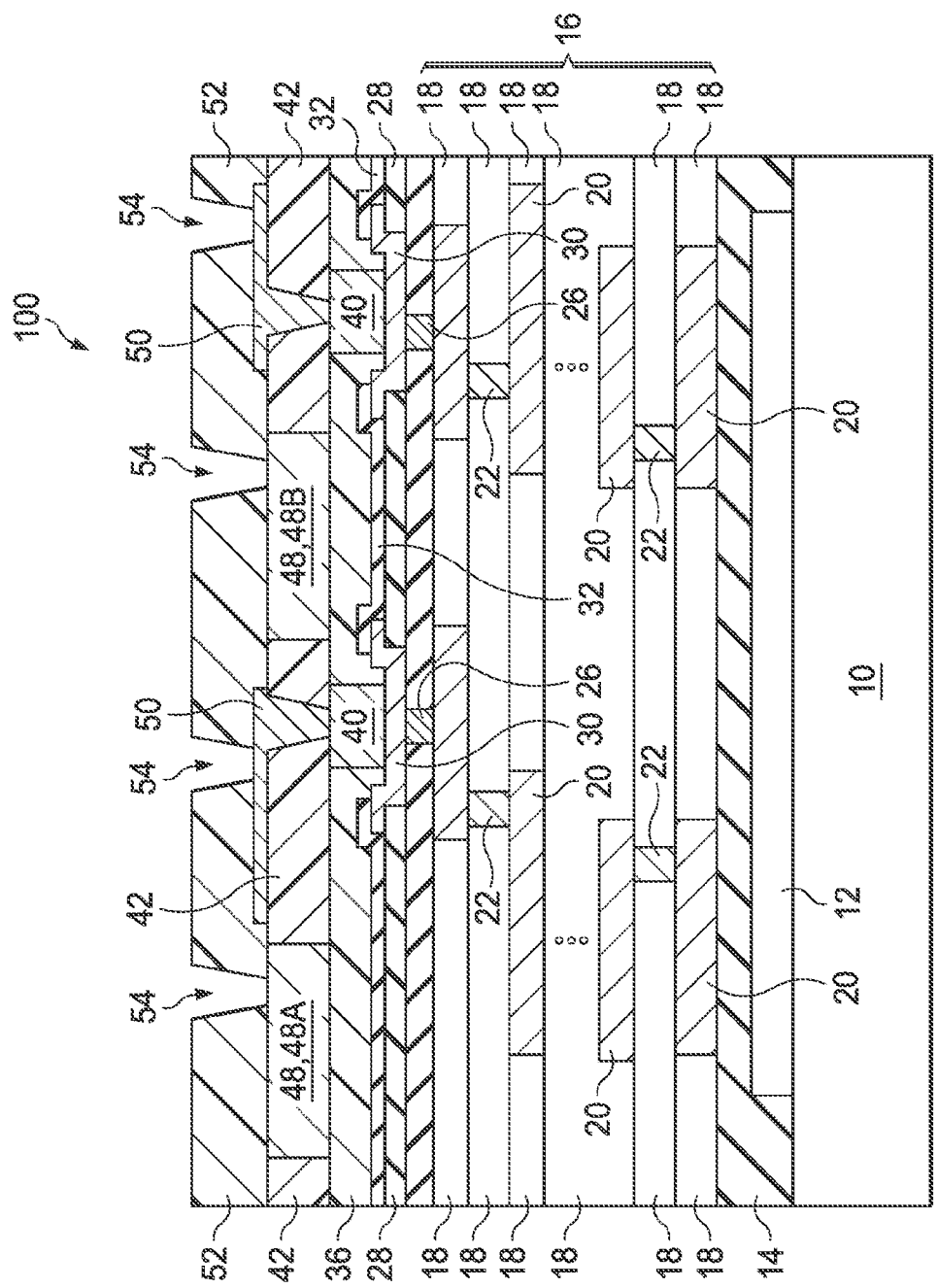

FIG. 6 illustrates the formation of polymer layer 52 and via openings 54 in polymer layer 52. In some embodiments, polymer layer 52 is formed of a material selected from the same candidate materials as the materials of polymer layers 36 and 42. In some embodiments, polymer layers 42 and 52 are formed of PBO, while polymer layer 36 is formed of polyimide. Polymer layers 42 and 52 may also have a thermal conductivity lower than the thermal conductivity of polymer layer 36. After the patterning of polymer layer 52, PPIs 50 and dummy metal pads 48 are exposed through via openings 54.

Figure 7:
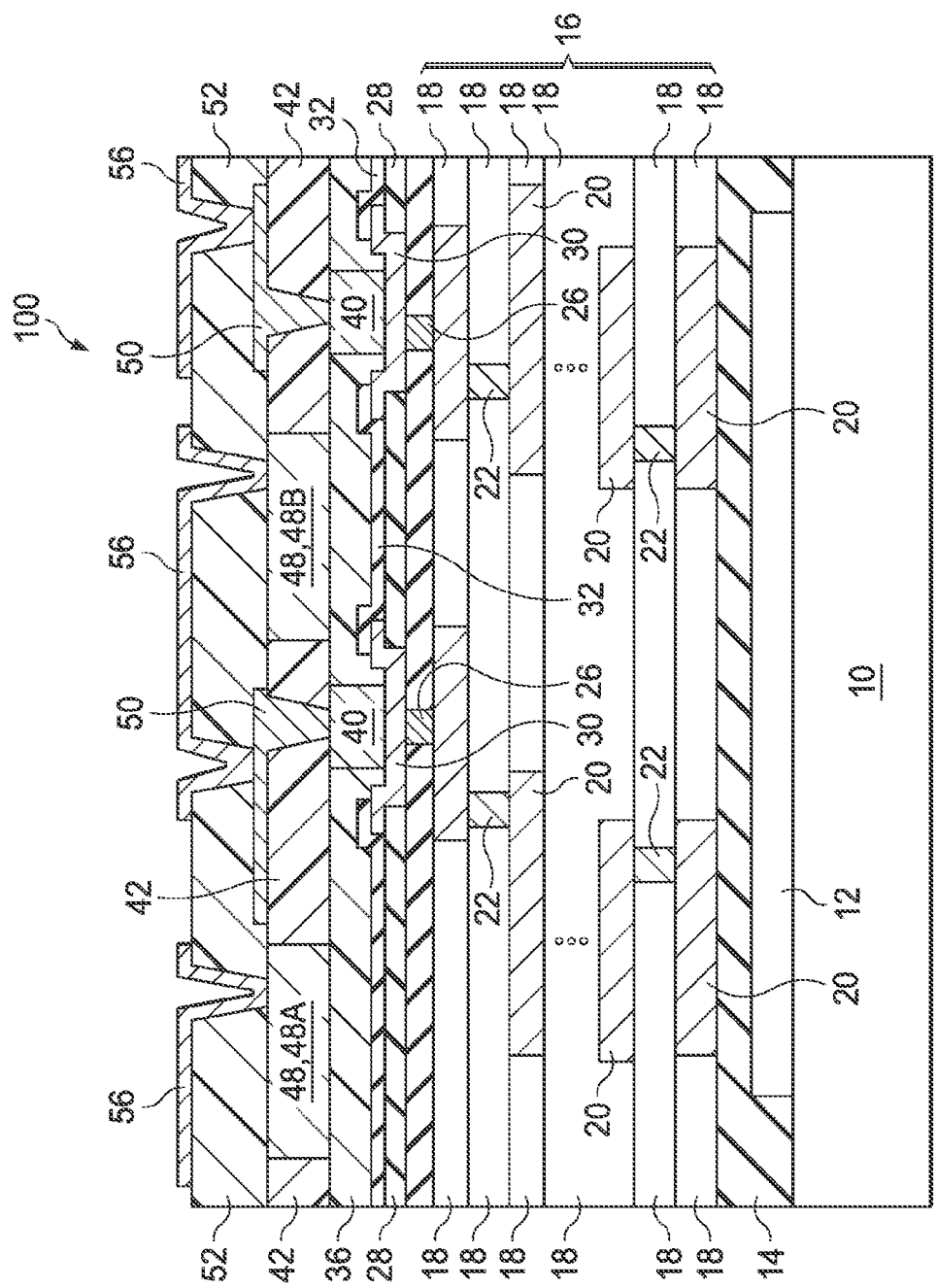

FIG. 7 illustrates the formation of PPIs 56, which are electrically connected to dummy metal pads 48 and PPIs 50. The formation of PPIs 56 may be essentially the same as described for PPIs 50.

Figure 8:
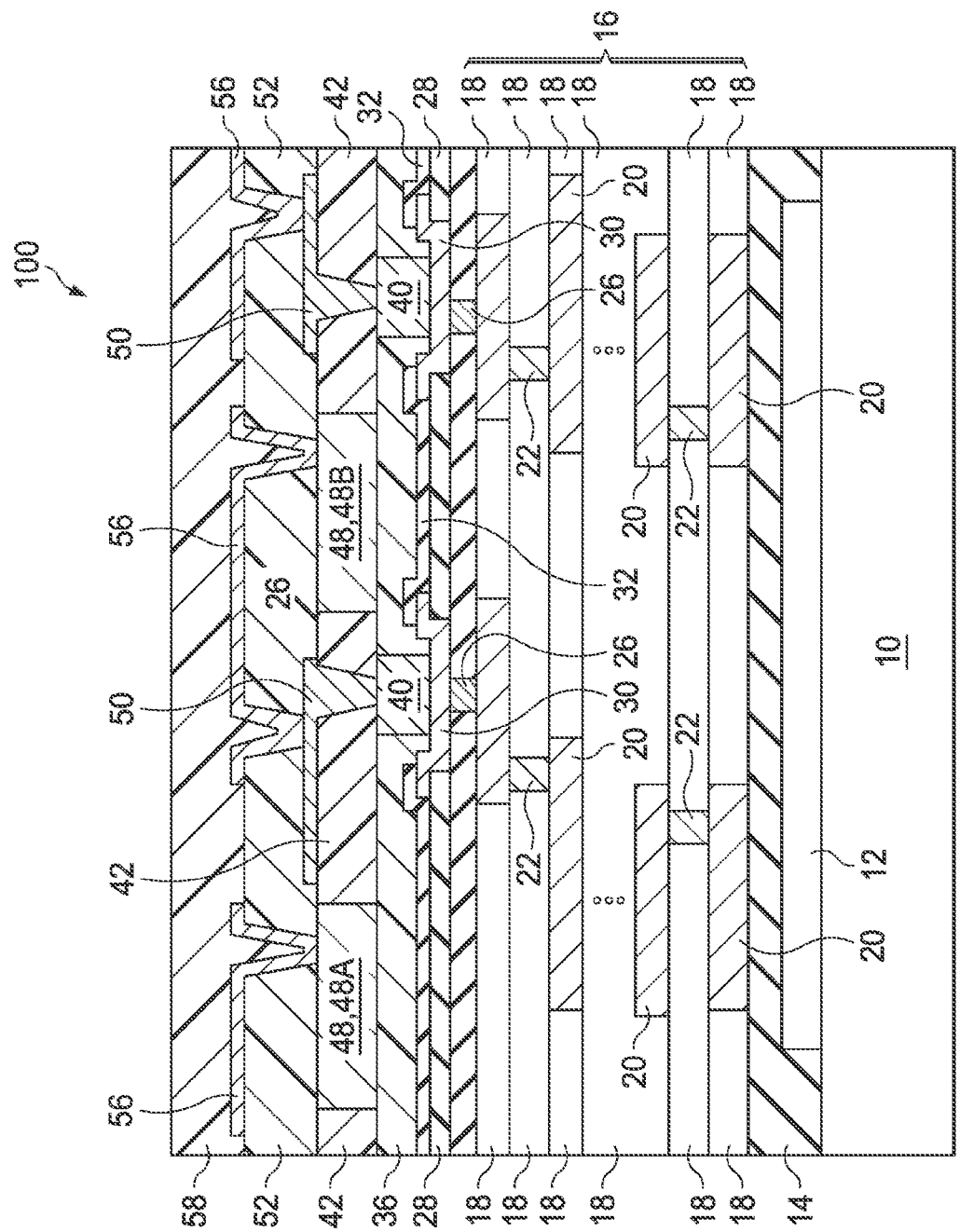
Figure 9:
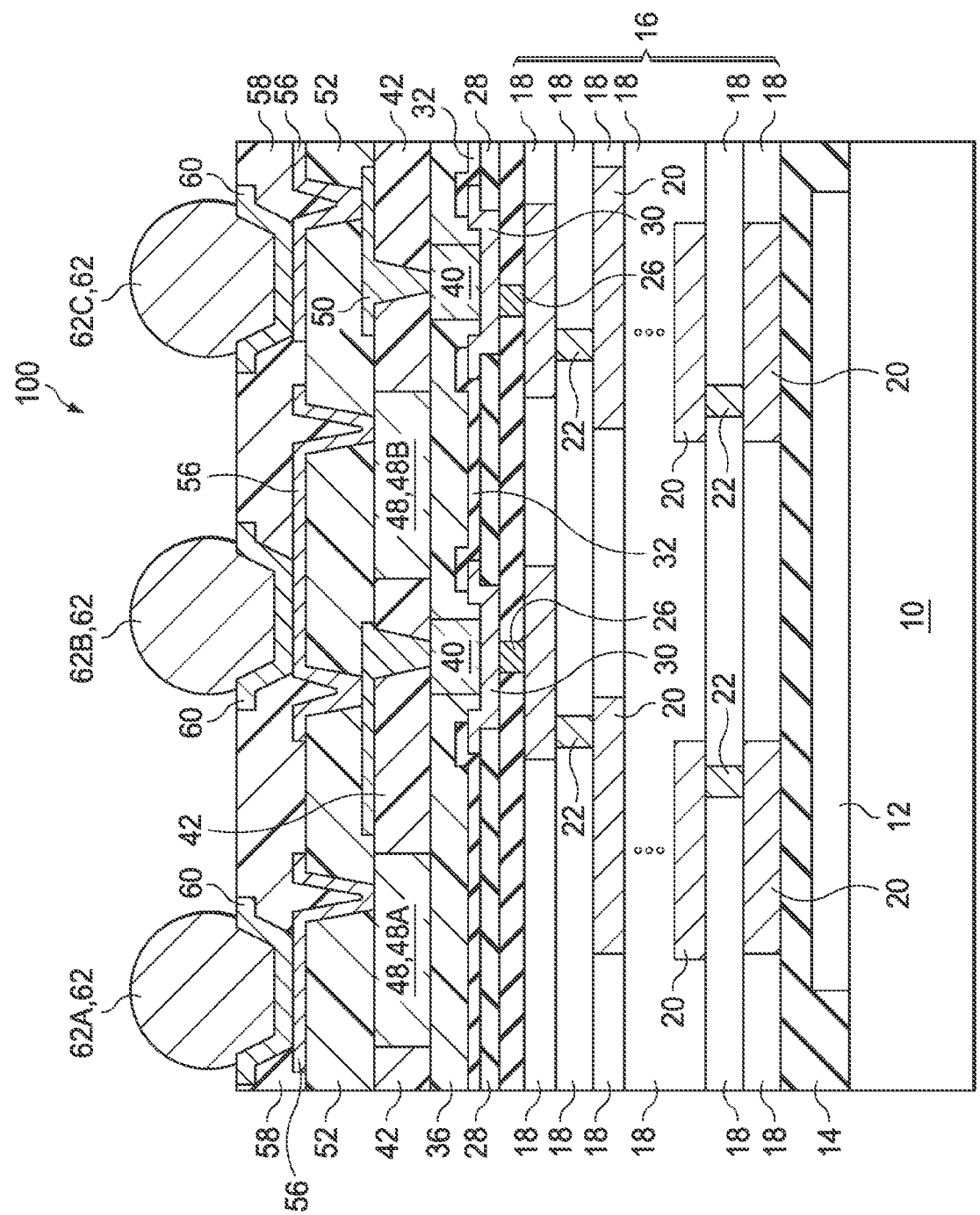

FIGS. 8 and 9 illustrate the formation of dielectric layer (such as a polymer layer) 58, conductive feature 60, and electrical connectors 62. Conductive feature 60 is also referred to as an Under-Bump-Metallurgy (UBM) throughout the description. Referring to FIG. 8, in some embodiments, an entirety of PPI 50 is covered by polymer layer 58. Polymer layer 58 may be formed of a material selected from the same group of candidate materials for forming polymer layers 36, 42, and/or 52. For example, polymer layer 58 may comprise polyimide or another polymer-based material such as PBO, BCB, an epoxy, or the like. Polymer layers 42, 52, and 58 may be formed of a same material, such as PBO, or different materials. In some embodiments, polymer layer 58 is formed using spin coating, and is then cured.

Next, as shown in FIG. 9, polymer layer 58 is patterned to expose PPIs 56, and UBMs 60 are formed in the respective openings. In some embodiments, each of UBMs 60 includes a barrier layer and a seed layer (not shown) over the barrier layer. UBMs 60 extend into the opening in polymer layer 58, and are electrically coupled to, and may be in physical contact with, PPIs 56. The barrier layer may be a titanium layer, a titanium nitride layer, a tantalum layer, a tantalum nitride layer, or layers formed of a titanium alloy or a tantalum alloy. The materials of the seed layer may include copper or copper alloys. In some embodiments, UBMs 60 are formed using PVD or other applicable methods.

Further referring to FIG. 9, electrical connectors 62 are formed. In some embodiments, electrical connectors 62 include metal regions, which are either metal balls such as solder balls or copper balls placed on UBM layer 60. Electrical connectors 62 may also be metal pillars formed on UBMs 60 through plating. In the embodiments electrical connectors 62 comprise solder, the solder may be plated, and the plating of solder and the formation of UBMs 60 may be similar to the formation of PPI 50. The metal pillars, when comprising solder, may then go through a reflow process, and the plated or placed solder is formed as electrical connectors 62. In alternative embodiments, electrical connectors 62 comprise non-reflowable metal pillars, which may be copper pillars. Additional layers such as a nickel layer, a palladium layer, and the like, may also be formed on each of the metal pillars.

Figure 10:
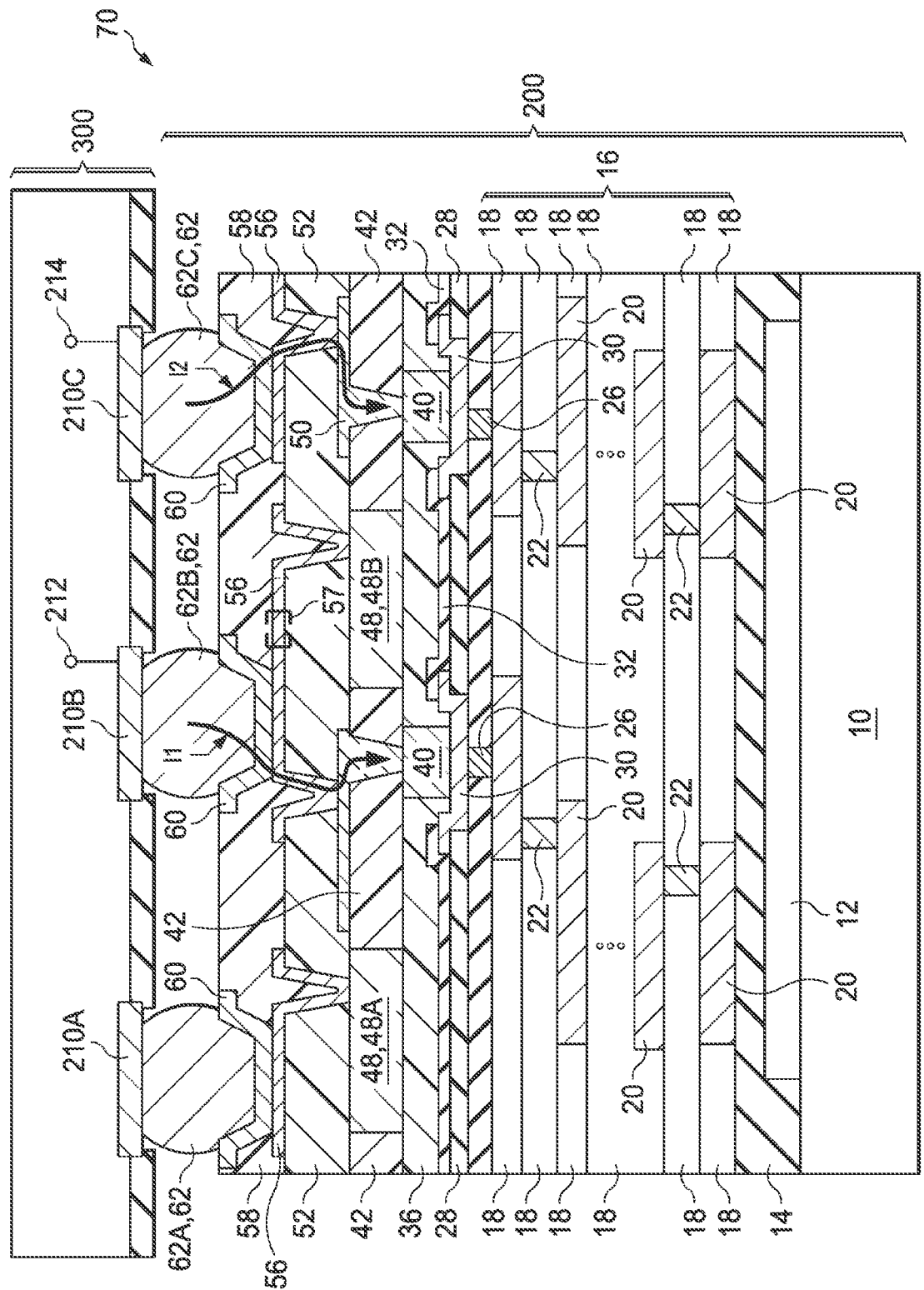

In a subsequent step, wafer 100 is diced into a plurality of dies. An exemplary die 200, as shown in FIG. 10, is then bonded to package component 300 to form package 70. Package component 300 may be a package substrate, an interposer, a Printed Circuit Board (PCB), or the like. Electrical connectors 62 are bonded to metal features 210 (including 210A, 210B, and 210C), which may be metal pads in some embodiments.

In die 200, electrical connector 62A is a dummy connector that is electrically floating. Electrical connector 62A and dummy metal pad 48A are not electrically connected to any signal node or power node in package 70. An entirety of the bottom surface of dummy metal pad 48A may be in contact with the top surface of polymer layer 36, and not in physical and/or electrical connection with any electrical conductive features in and/or underlying, polymer layer 36. Electrical connector 62A and dummy metal pad 48A and the PPIs therebetween form an effective thermal conductive path for conducting the heat in polymer layer 36 to package component 300, wherein metal pad 210A may be connected to a heat dissipating feature (not shown) in package component 300.

Dummy metal pad 48B is electrically connected to electrical connector 62B. In some embodiments, electrical connector 62B is connected to electrical ground (such as VSS) or a positive or negative power supply node such as VDD, which is schematically illustrated as node 212. In alternative embodiments, electrical connector 62B is electrically connected to a signal node 214 that carries a signal (which may be a time-variant signal). In some embodiments, current I1 flows through electrical connector 62B. Hence, dummy metal pad 48B carries the same voltage as electrical connector 62B, which voltage may be an electrical ground voltage, a positive power supply voltage, a negative power supply voltage, or a signal voltage. An entirety of the bottom surface of dummy metal pad 48B may be in contact with the top surface of polymer layer 36, and not in physical and/or electrical connection with any electrical conductive features in and/or underlying, polymer layer 36. In some embodiments, dummy metal pad 48B has a single electrical path 57, through which dummy metal pad 48B receives voltages, wherein if electrical path 57 is cut, dummy metal pad 48 may be electrically floating. Accordingly, no current flows through dummy metal pad 48B, although dummy metal pad 48B receives the same voltage that electrical connector 62B has. Electrical connector 62B, dummy metal pad 48B, and the PPIs therebetween form an effective thermal conductive path for conducting the heat in polymer layer 36 to package component 300. Metal pad 210B may be connected to a heat dissipating feature (not shown) in package component 300.

Electrical connector 62C may be used to electrically couple integrated circuit devices 12 in die 200 to metal pad 210C in package component 300, so that electrical signals may be transferred to/from each other. Electrical connector 62C may have current I2 flowing through. Electrical connector 62C and metal pad 30 also form a thermal conductive path.

Dummy metal pads 48 have the function of improving heat dissipation. In accordance with some embodiments, dummy metal pads 48 are distributed uniformly throughout die 200 to make the heat dissipation throughout die 200 more uniform. In alternative embodiments, dummy metal pads 48 are distributed according to the heat generating pattern in die 200, and the hot spots in die 200, which hot spots have more heat generated than other regions, may be distributed with more dummy metal pads 48 than less-heated regions.

Figure 11:
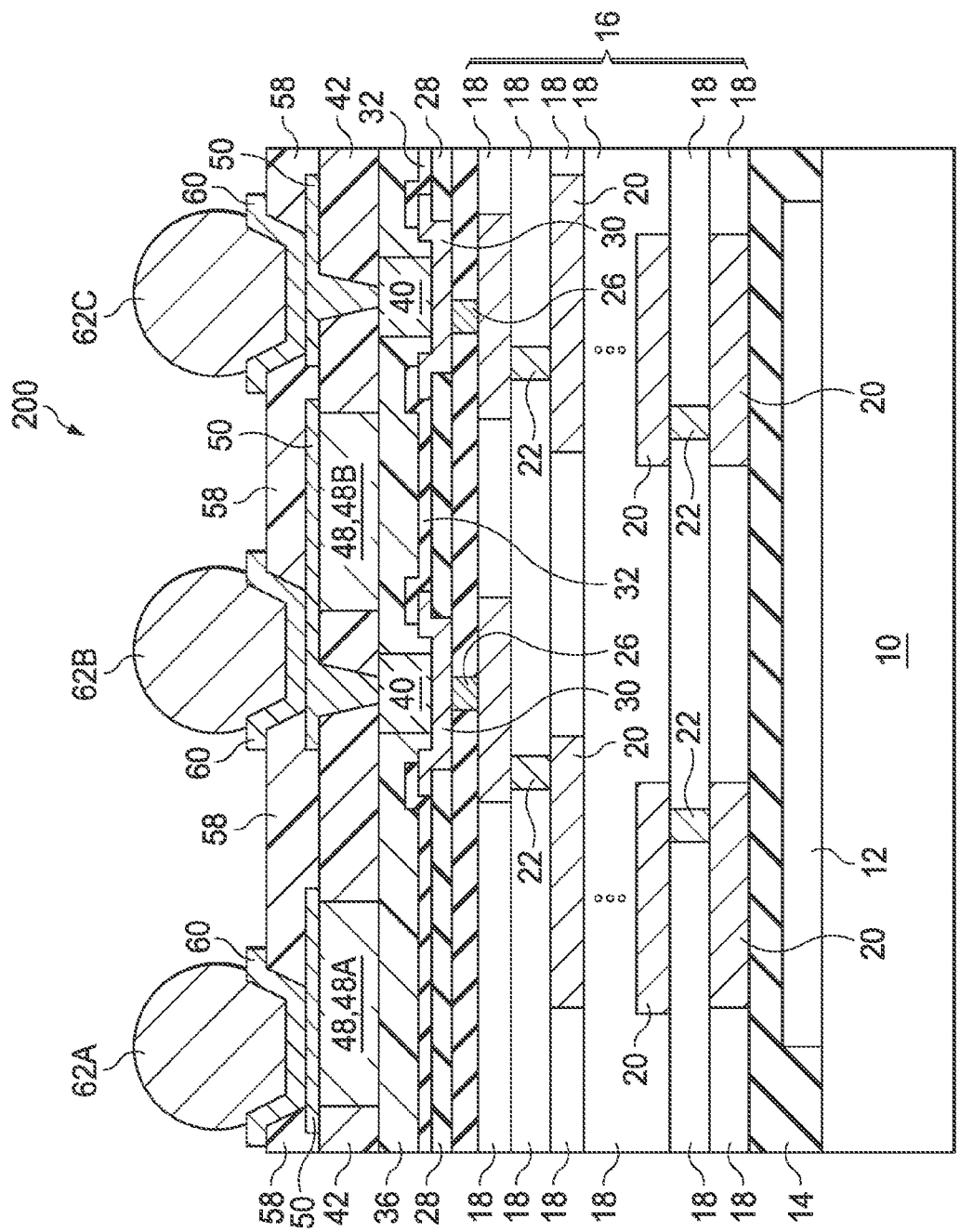
FIG. 11 illustrates a wafer die including dummy metal pads in accordance with some alternative exemplary embodiments.

In the embodiments in FIGS. 1 through 10, two PPI layers 50 and 56 are formed. In alternative embodiments, a single PPI layer is formed. FIG. 11 illustrates the cross-sectional view of the respective die 200 in accordance with some exemplary embodiments. These embodiments are essentially the same as shown in FIG. 10, except that PPI 56 and polymer layer 52 that are shown in FIG. 10 are not formed.

Throughout the description, although layers 36, 42, 52, and 58 are referred to as polymer layers, they can also be dielectric layers formed of dielectric materials other than polymer. For example, each of dielectric layers 36, 42, 52, and 58 may be formed of glass, Ajinomoto Build-up Film (ABF), ceramic, or other applicable materials.

The formation of dummy metal pads may significantly improve the heat dissipation in the respective die. FIG. 12 illustrates the simulation results. In FIG. 12, the Y axis represents the effective thermal conductivity of polymer layer 42 (FIGS. 10 and 11), wherein the effective thermal conductivity has taken into consideration of the heat conducting ability of polymer layer 42 itself and all metal features formed therein. The X axis represents the percentage of the total area of all dummy metal pads in polymer layer 42 with relative to the total area of the respective die. Line 72 shows that when the total area of dummy metal pads increases, the effective thermal conductivity also increases. The simulation results indicate that if the dummy metal pads occupy 1 percent of the area of the respective die, it is equivalent to increasing the effective thermal conductivity of polymer layer 42 by about 5 W/m-° C. Considering that the thermal conductivity values of typical polymer layers are smaller than about 0.5 W/m-° C., allocating one percent of the die area to form the dummy metal pads is equivalent to increasing the thermal conductivity of polymer layer 42 by ten times.

In accordance with other embodiments, an integrated circuit structure includes a metal pad, a passivation layer including a portion over the metal pad, a first polymer layer over the passivation layer, and a first PPI extending into to the first polymer layer. The first PPI is electrically connected to the metal pad. A dummy metal pad is located in the first polymer layer. A second polymer layer is overlying the first polymer layer, the dummy metal pad, and the first PPI. A UBM extends into the second polymer layer to electrically couple to the dummy metal pad.

In accordance with other embodiments, an integrated circuit structure includes a semiconductor substrate, an interconnect structure over the semiconductor substrate, a passivation layer over the interconnect structure, and a metal pad over the interconnect structure. The passivation layer covers a portion of the metal pad. The integrated circuit structure further includes a metal pillar over and contacting the metal pad, a first polymer layer over the passivation layer and the metal pillar, and a PPI including a via portion in the first polymer layer, and a line portion over the first polymer layer, wherein the via portion is overlying and electrically connected to the metal pillar. A dummy metal pad is in the first polymer layer. A second polymer layer is over the first polymer layer. A UBM extends into the second polymer layer, wherein the UBM is electrically coupled to the metal pad and the dummy metal pad.

In accordance with yet other embodiments, a method includes forming a metal pad over an interconnect structure, and forming a passivation layer over the interconnect structure. The passivation layer includes a portion over the metal pad. The method further includes forming a first polymer layer over the passivation layer, and forming a dummy metal pad in the first polymer layer. At a time the dummy metal pad is formed, the dummy metal pad is a discrete metal pad fully encircled by the first polymer layer, and an entirety of the dummy metal pad is disconnected from other conductive features. The method further includes forming a second polymer layer over the dummy metal pad and the first polymer layer, and forming a UBM extending into the second polymer layer. The UBM is electrically coupled to the dummy metal pad.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method, comprising:
   forming a metal pad over an interconnect structure;
   forming a first polymer layer over the metal pad;
   forming a dummy metal pad in the first polymer layer and a first via in the first polymer layer, wherein at a time of forming the dummy metal pad, an entirety of the dummy metal pad is disconnected from other conductive features;
   forming a second polymer layer over the first polymer layer;
   forming a redistribution line in the second polymer layer, wherein the redistribution line electrically couples the first via to the dummy metal pad; and
   forming an Under-Bump-Metallurgy extending into the second polymer layer, wherein the Under-Bump-Metallurgy is electrically coupled to the dummy metal pad.

2. The method of claim 1, further comprising:
   forming an additional dummy metal pad in the first polymer layer; and
   forming a first electrical connector and a second electrical connector over the first polymer layer, the first electrical connector being electrically connected to the dummy metal pad, the second electrical connector being electrically connected to the additional dummy metal pad; and
   connecting the first electrical connector to a voltage source, wherein the second electrical connector and the additional dummy metal pad are electrically floating.

3. The method of claim 1, wherein forming the redistribution line in the second polymer layer comprises:
   depositing conductive material of the redistribution line over the first polymer layer; and
   depositing the second polymer layer over and around the redistribution line.

4. The method of claim 1, wherein forming the redistribution line in the second polymer layer comprises:
   depositing a third polymer layer over the first polymer layer;
   forming a first opening to expose the first via and a second opening to expose the dummy metal pad;
   forming a second via in the first opening and a third via in the second opening;
   forming the redistribution line over the second via, the third via, and the third polymer layer; and
   depositing the second polymer layer over the redistribution line and the third polymer layer.

5. The method of claim 1, further comprising:
   forming a fourth polymer layer over the metal pad; and
   forming a metal pillar in the fourth polymer layer.

6. The method of claim 5, wherein the first via physically contacts the metal pillar, and wherein an entirety of a bottom surface of the dummy metal pad physically contacts the fourth polymer layer.

7. The method of claim 5, further comprising:
   before forming the metal pad, forming a first passivation layer over the interconnect structure; and
   after forming the metal pad, forming a second passivation layer over the metal pad, wherein a portion of the metal pad is directly interposed between the first passivation layer and the second passivation layer.

8. A method, comprising:
   forming an interconnect structure comprising conductive lines, conductive vias, and dielectric layers, an uppermost dielectric layer of the dielectric layers having a first dielectric constant;
   depositing a first passivation layer over the interconnect structure, the first passivation layer having a second dielectric constant greater than the first dielectric constant;
   forming a first metal pad through and over the first passivation layer;
   depositing a first polymer layer over the first passivation layer;
   forming a metal pillar over the first metal pad and within the first polymer layer;
   forming a second polymer layer over the first polymer layer;
   patterning a first opening, a second opening, and a third opening in the second polymer layer, the first opening having a first diameter, the second opening having a second diameter different from the first diameter; and
   plating a first via in the first opening, a second metal pad in the second opening, and a third metal pad in the third opening.

9. The method of claim 8, further comprising:
   forming a first electrical connector over and electrically connected to the first via and to the second metal pad; and
   forming a second electrical connector over and electrically connected to the third metal pad.

10. The method of claim 9, wherein the third metal pad and the second electrical connector are electrically floating.

11. The method of claim 8, wherein plating the first via in the first opening comprises forming a first redistribution line over the second polymer layer.

12. The method of claim 11, wherein the first redistribution line electrically connects the first via to the second metal pad.

13. The method of claim 8, further comprising:
    depositing a third polymer layer over the second polymer layer;

patterning the third polymer layer to form a plurality of openings to expose the first via, the second metal pad, and the third metal pad; and plating the plurality of openings to form a second via electrically connected to the first via, a third via electrically connected to the second metal pad, and a fourth via electrically connected to the third metal pad.

14. The method of claim 13, wherein plating the plurality of openings comprises forming a second redistribution line over the third polymer layer, and wherein the second redistribution line electrically connects the second via to the third via.

15. The method of claim 8, wherein the second diameter is greater than the first diameter.

16. A method, comprising:

forming an interconnect structure over a substrate;

forming a first conductive feature and a second conductive feature over and electrically connected to the interconnect structure;

depositing a first polymer layer over the first conductive feature and the second conductive feature;

patterning to form first openings in the first polymer layer;

forming a first redistribution structure, a second redistribution structure, and a first dummy metal pad in the first openings, wherein the first redistribution structure and the second redistribution structure are formed of a conductive material;

depositing a second polymer layer over the first polymer layer, wherein the first redistribution structure and the second redistribution structure have a first height and the first dummy metal pad has a second height, the first height being greater than the second height; and forming a first electrical connector and a second electrical connector over the second polymer layer.

17. The method of claim 16, wherein the first redistribution structure is electrically connected to the first conductive feature, the first dummy metal pad, and the first electrical connector.

18. The method of claim 17, wherein the second redistribution structure is electrically connected to the second conductive feature and the second electrical connector.

19. The method of claim 16, further comprising:

forming a second dummy metal pad in one of the first openings in the first polymer layer; and forming a third electrical connector over the second polymer layer.

20. The method of claim 16, further comprising attaching the first electrical connector and the second electrical connector to a package component, wherein the package component supplies a voltage and a current to the first redistribution structure, and wherein the first dummy metal pad receives the voltage and remains free of the current.

* * * * *